(12) United States Patent
Trivedi et al.

(10) Patent No.: US 11,520,721 B2
(45) Date of Patent: *Dec. 6, 2022

(54) DIGITAL INTERFACE CIRCUIT FOR SEQUENCING ANALOG-TO-DIGITAL CONVERTER

(71) Applicants: STMicroelectronics International N.V., Geneva (CH); STMicroelectronics Application GMBH, Aschheim-Dornach (DE)

(72) Inventors: Nirav Prashantkumar Trivedi, Noida (IN); Sandip Atal, Greater Noida (IN); Rolf Nandlinger, Herrsching (DE)

(73) Assignees: STMICROELECTRONICS INTERNATIONAL N.V., Geneva (CH); STMICROELECTRONICS APPLICATION GMBH, Aschheim-Dornach (DE)

( * ) Notice: Subject to any disclaimer, the term of this patent is extended or adjusted under 35 U.S.C. 154(b) by 123 days.

This patent is subject to a terminal disclaimer.

(21) Appl. No.: 16/933,752

(22) Filed: Jul. 20, 2020

(65) Prior Publication Data
US 2021/0004339 A1 Jan. 7, 2021

Related U.S. Application Data

(63) Continuation of application No. 16/503,243, filed on Jul. 3, 2019, now Pat. No. 10,740,267.

(51) Int. Cl.
*G06F 13/00* (2006.01)
*G06F 13/28* (2006.01)
*H03M 1/38* (2006.01)
*H03M 1/12* (2006.01)

(52) U.S. Cl.
CPC .......... *G06F 13/28* (2013.01); *H03M 1/1225* (2013.01); *H03M 1/38* (2013.01)

(58) Field of Classification Search
CPC ........ G06F 13/28; H03M 1/38; H03M 1/1225
See application file for complete search history.

(56) References Cited

U.S. PATENT DOCUMENTS

| | | | |
|---|---|---|---|
| 5,168,276 A | 12/1992 | Huston et al. | |
| 6,701,395 B1 * | 3/2004 | Byrne | G06F 3/05 710/28 |
| 7,299,302 B2 * | 11/2007 | Muro | G06F 13/28 710/33 |
| 7,532,136 B2 | 5/2009 | McMahon et al. | |
| 8,527,671 B2 * | 9/2013 | Bond | G06F 13/28 710/110 |
| 9,032,116 B2 * | 5/2015 | Pedersen | G06F 13/28 710/308 |
| 9,047,270 B2 * | 6/2015 | Wu | G06F 13/28 |

(Continued)

*Primary Examiner* — Tammara R Peyton
(74) *Attorney, Agent, or Firm* — Slater Matsil, LLP

(57) ABSTRACT

A digital interface circuit includes a queue block configured to be coupled between an analog-to-digital converter (ADC) and a Direct Memory Access (DMA) controller of a processor, where the queue block comprises a command buffer and is configured to: receive a first command from the DMA controller; store the first command in the command buffer; modify the first command in accordance with first control bits of the first command to generate a modified first command; and send the modified first command to the ADC.

20 Claims, 10 Drawing Sheets

(56) References Cited

U.S. PATENT DOCUMENTS

| | | |
|---|---|---|
| 10,594,331 B2 * | 3/2020 | Hayashi ................. H03M 1/123 |
| 10,740,267 B1 * | 8/2020 | Trivedi ................... G06F 13/28 |
| 2014/0055292 A1 * | 2/2014 | Shepherd ............ H03M 1/1225 |
| | | 341/155 |
| 2018/0054209 A1 | 2/2018 | Kris |

* cited by examiner

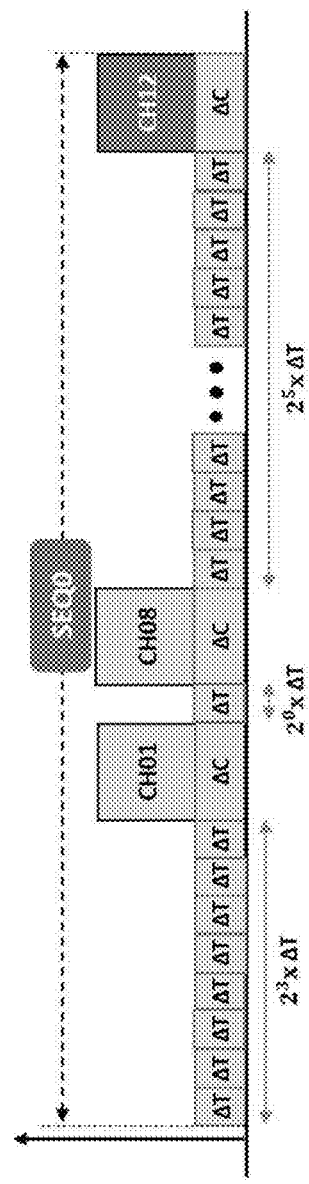

US 11,520,721 B2

DIGITAL INTERFACE CIRCUIT FOR SEQUENCING ANALOG-TO-DIGITAL CONVERTER

PRIORITY CLAIM AND CROSS-REFERENCE

This patent application is a continuation of U.S. application Ser. No. 16/503,243, filed on Jul. 3, 2019, which application is hereby incorporated by reference herein in its entirety.

TECHNICAL FIELD

The present invention relates generally to analog-to-digital (A/D) conversion systems, and, in particular embodiment, to an A/D conversion system with a digital interface circuit.

BACKGROUND

Analog-to-digital converters (ADCs) are broadly used in electronic systems to convert analog signals, such as electrical voltages or electrical currents, into digital signals for processing in digital systems. Various types of ADCs are available, such as direct-conversion ADC, successive approximation ADC (SARADC), sigma-delta ADC, or the like.

An analog-to-digital (A/D) conversion system includes at least an ADC, and may include other functional modules such as a multiplexer for selecting the analog channel that is connected to and converted by the ADC. The A/D conversion system may additionally include a controller (e.g., a processor) to control the operation of the A/D conversion system. Efficient communication between the controller and the ADC is a challenge, since transferring the control commands and converted digital data between the controller and the ADC may consume a significant amount of resource of the controller. There is a need in the art for analog-to-digital conversion systems that achieve efficient communication between the controller and the ADC.

SUMMARY

In some embodiments, an analog-to-digital conversion system includes an analog-to-digital converter (ADC); a multiplexer, wherein the multiplexer has a plurality of input channels that are configured to be coupled to a plurality of analog input signals, wherein an output terminal of the multiplexer is coupled to an input terminal of the ADC; and a digital interface circuit configured to be coupled between the ADC and a processor, wherein the digital interface circuit is configured to: receive a sequence of commands from the processor, wherein each command of the sequence of commands comprises a channel number that indicates an input channel of the multiplexer, wherein channel numbers contained in the sequence of commands define a channel sequence; store the sequence of commands in a command First-In First-Out (FIFO) buffer of the digital interface circuit; send the sequence of commands stored in the command FIFO buffer to the ADC for a first time to control operation of the ADC, wherein analog input signals at input channels of the multiplexer specified by the channel sequence are converted into digital data sequentially for the first time; and send the sequence of commands stored in the command FIFO buffer to the ADC for a second time, wherein the analog input signals at the input channels of the multiplexer specified by the channel sequence are converted into digital data sequentially for the second time.

In some embodiments, a digital interface circuit includes a queue block configured to be coupled between an analog-to-digital converter (ADC) and a Direct Memory Access (DMA) controller of a processor, wherein the queue block comprises a command buffer and is configured to: receive a first command from the DMA controller; store the first command in the command buffer; modify the first command in accordance with first control bits of the first command to generate a modified first command; and send the modified first command to the ADC.

In some embodiments, a method of operating an analog-to-digital conversion system includes sending a sequence of commands from a processor to a queue block, wherein the queue block is coupled between the processor and an analog-to-digital converter (ADC), the ADC being coupled to a multiplexer, and the multiplexer having a plurality of input channels connected to a plurality of analog input signals, wherein each command in the sequence of commands comprises control bits indicating a channel number, a channel repeat factor, and a channel delay number; decoding, by the queue block, control bits of each command to obtain the channel number, the channel repeat factor, and the channel delay number in each command; generating, by the queue block, a modified sequence of commands by modifying each command in accordance with the control bits of each command; and sending, by the queue block, the modified sequence of commands to the ADC to control operation of the ADC.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, which will generally not be re-described in the interest of brevity. For a more complete understanding of the invention, reference is now made to the following descriptions taken in conjunction with the accompanying drawings, in which:

FIGS. 6A and 6B illustrate the channel oversampling operation of the A/D conversion system of FIG. 1, in an embodiment;

FIGS. 8A and 8B illustrate the programmable delay operation of the A/D conversion system of FIG. 1, in another embodiment;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely an analog-to-digital (A/D) conversion system with a digital interface circuit coupled between a controller of the A/D conversion system and an analog-to-digital converter (ADC) of the A/D conversion system.

Figure 1:
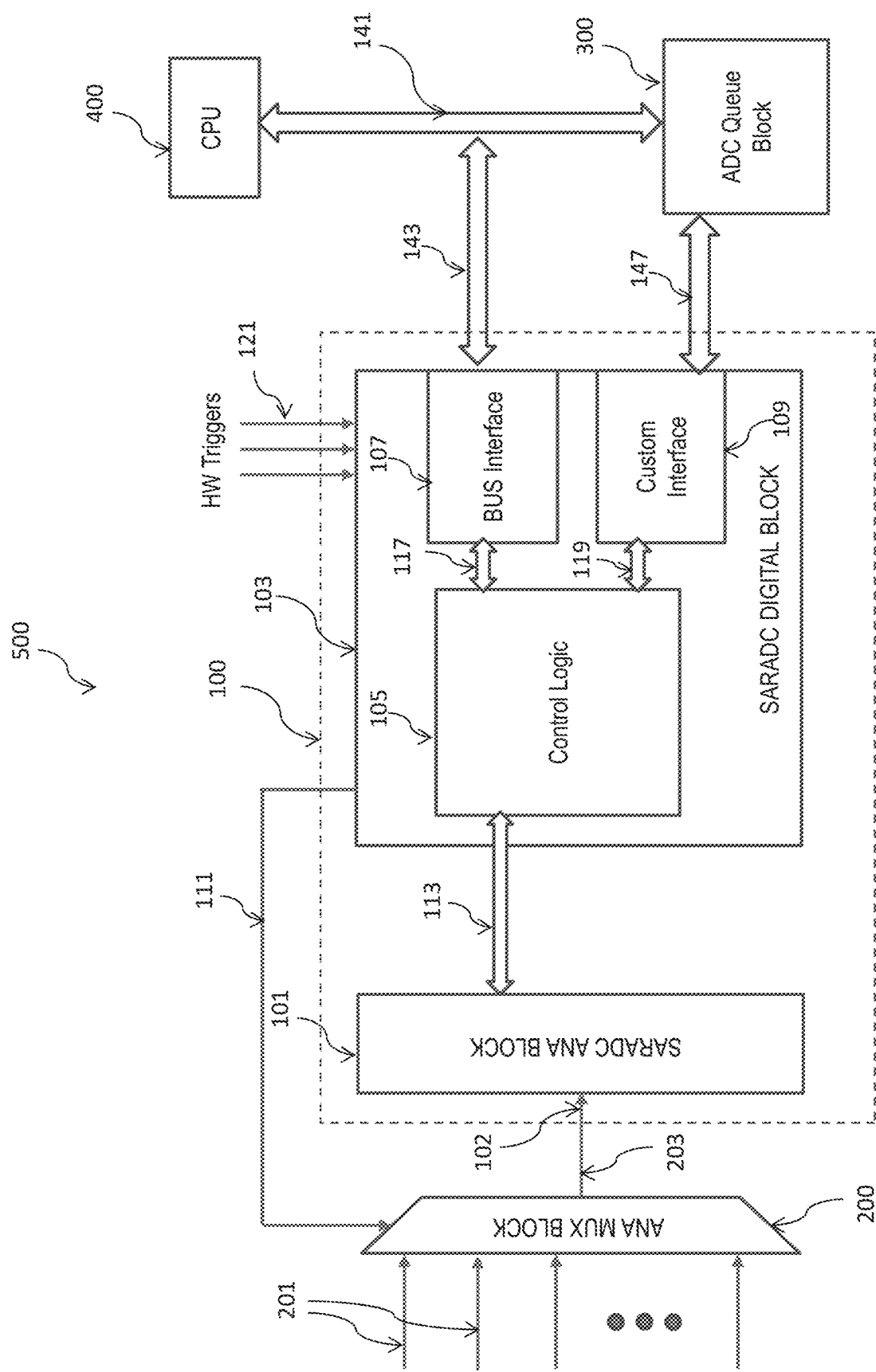
FIG. 1 illustrates a block diagram of an analog-to-digital (A/D) conversion system, in an embodiment.

FIG. 1 illustrates a block diagram of an analog-to-digital (A/D) conversion system 500, in an embodiment. The A/D conversion system 500 includes an analog-to-digital converter (ADC) 100, a multiplexer 200, a digital interface block 300 (may also be referred to as a digital interface circuit, or an ADC queue block), and a controller 400. In the description herein, the ADC 100 may be referred to as a successive approximation ADC (SARADC), with the understanding that the SARADC is merely a non-limiting example of the ADC 100, and any other suitable type of ADC may also be used as the ADC 100.

As illustrated in FIG. 1, the ADC 100 includes an analog block 101 which converts the analog input signal at an input terminal 102 of the analog block 101 into digital data (also referred to as digital samples). The ADC 100 also includes a digital block 103 for controlling the operation of the analog block 101 and for communicating with other blocks in the A/D conversion system 500, such as the controller 400 and the digital interface block 300. The digital block 103 includes a control logic 105, which provides control signals, such as sampling clock signal, enable/disable signal for the analog block 101, and channel selection signal for the multiplexer 200. The digital block 103 also includes various interfaces, such as a bus interface 107 for communicating with the controller 400, and a custom interface for communicating with the digital interface block 300. A plurality of trigger signals 121 are coupled to the ADC 100 for various functions such as interrupt request and triggering. FIG. 1 also illustrates the various control/data paths (e.g., 111, 113, 117, 119, 143, and 147) between functional modules of the ADC 100, and between the ADC 100 and other functional blocks. The control/data paths may be bi-directional or unidirectional, and depending on the signal type, may be a one-bit control/data path or a multi-bit control/data path.

Still referring to FIG. 1, the multiplexer 200 has a plurality of input channels 201 (also referred to as ADC channels), each of which is configured to be connected to an analog input signal (e.g., a voltage signal, or a current signal). Depending on the control signal from the control path 111, one of the input channels 201 is selected and sent to an output terminal 203 of the multiplexer 200. The output terminal 203 is connected to the input terminal 102 of the ADC 100. When the analog signal at an input channel of the multiplex 200 is converted into digital data by the ADC 100, the input channel of the multiplexer 200 (also referred to as an ADC channel) is said to be converted by the ADC 100.

The controller 400 (also referred to as a processor) may be or include a central processing unit (CPU), a digital signal processor (DSP), a micro-controller (μ-controller), or the like. The controller 400 controls the operation of the ADC 100 (and the multiplexer 200) by sending commands to the ADC 100, and/or by setting control bits in the control registers of the ADC 100 through the BUS interface 107 or the custom interface 109. For example, the controller 400 may set the ADC 100 in a single channel conversion mode, where the analog signal at a specific channel of the multiplexer 200 is selected and converted into a digital stream at a specific sampling frequency. As another example, the controller 400 may set the ADC 100 in a scan mode, where a list of channels of the multiplexer 200 are selected by the controller, and the analog signals at those channels are converted into digital data sequentially in the order the channels appear in the channel list in each scan. In some embodiments, the controller 400 controls the scan mode operation of the ADC 100 by setting control registers of the ADC 100 through the BUS interface 107 and/or sending control commands to the ADC 100 through the BUS interface 107, however, the scan mode operation controlled through the BUS interface 107 may have limited functionality, e.g., the channel list may not be flexible and the channel numbers in the channel list may have to be in, e.g., an increasing order. In addition, enhanced features, such as programmable channel delay and channel oversampling (described in more details hereinafter), may be difficult to achieve through the BUS interface 107. With the digital interface block 300 and the customer interface 109, these and other enhanced features of the ADC 100 are supported and easily achieved, details of which are discussed hereinafter.

FIG. 1 further illustrates the digital interface block 300, also referred to as a digital interface circuit, or an ADC queue block. The digital interface block 300 is coupled between the controller 400 and the ADC 100, and functions to improve the efficiency of the communication between the controller 400 and the ADC 100 and to support various enhanced features of the ADC, such as flexible channel ordering in the channel list, programmable channel delay, and channel oversampling. In some embodiments, the digital interface block 300 accepts commands (may also be referred to as measurement commands) from the controller 400, stores the commands in a buffer of the digital interface block 300. Next, the digital interface block 300 decodes the controls bits embedded in the commands, generates modified commands in accordance with the control bits, and sends the modified commands to the ADC 100 to control operation of the ADC 100. The digital interface block 300 also accepts and stores the converted digital data from the ADC 100, and sends the digital data to the controller 400 using Direct Memory Access (DMA) transfer, in the illustrated embodiment. The digital interface block 300 communicates with the controller 400 through data/control path 141. More details of the digital interface block 300 are discussed hereinafter.

Figure 2:
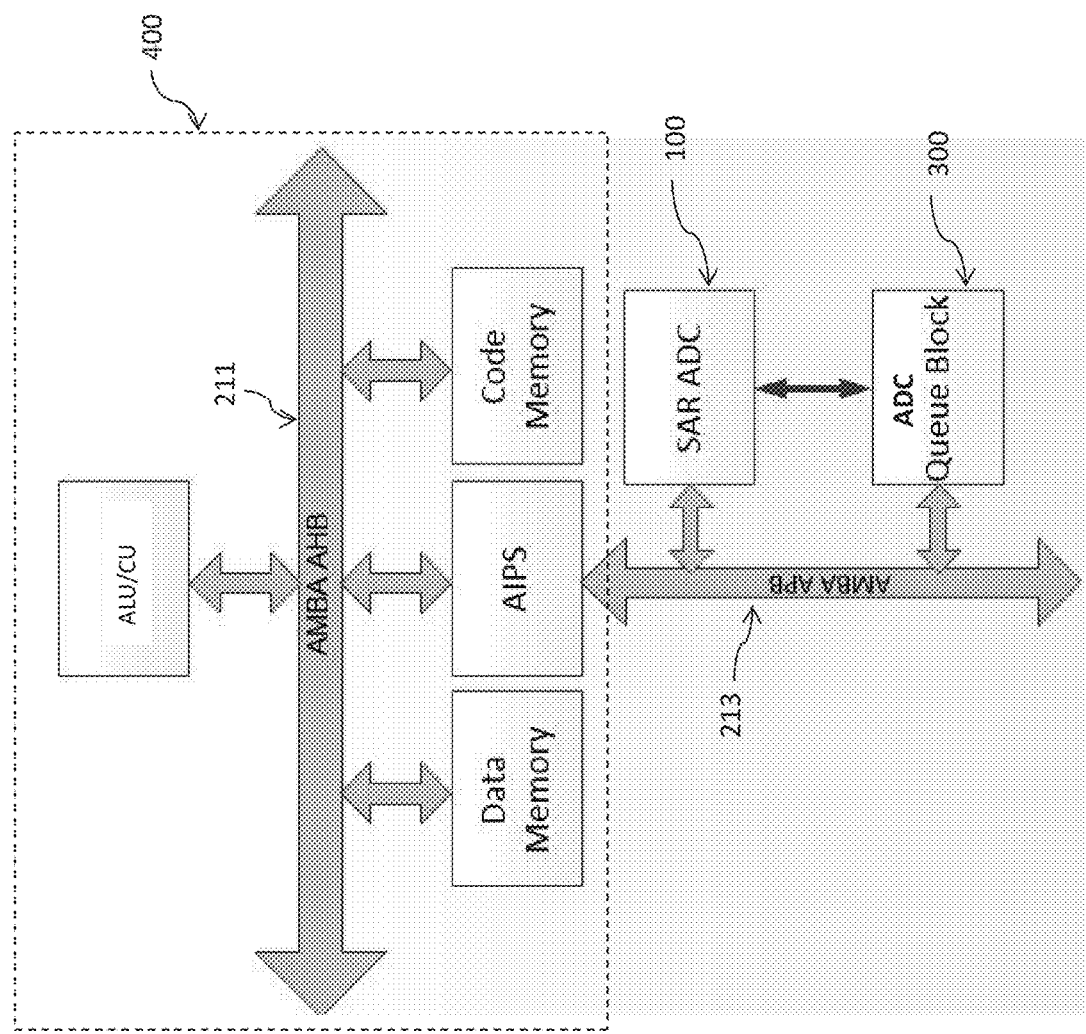
FIG. 2 illustrates the bus architecture of the A/D conversion system of FIG. 1, in an embodiment.

FIG. 2 illustrates the bus architecture of the A/D conversion system 500 of FIG. 1, in an embodiment. Note that for clarity, not all components of the A/D conversion system 500 are illustrated in FIG. 2.

In the example of FIG. 2, the controller 400 includes a control/logic unit (e.g., an Arithmetic Logic Unit (ALU) and a Control Unit (CU)), a data memory, a code memory, and an AIPS block. The control/logic unit accesses the data memory, the code memory, and the AIPS block via an AMBA High-performance Bus (AHB) 211, where AMBA stands for Advanced Microcontroller Bus Architecture, which is an open-standard, on-chip interconnect specification. The AIPS block functions as a bridge (e.g., an interface) between the AHB 211 and a peripheral bus, such as an AMBA Advanced Peripheral Bus (APB) 213. The ADC 100 and the digital interface block 300 are connected to the AMBA APB 213.

Figure 3:
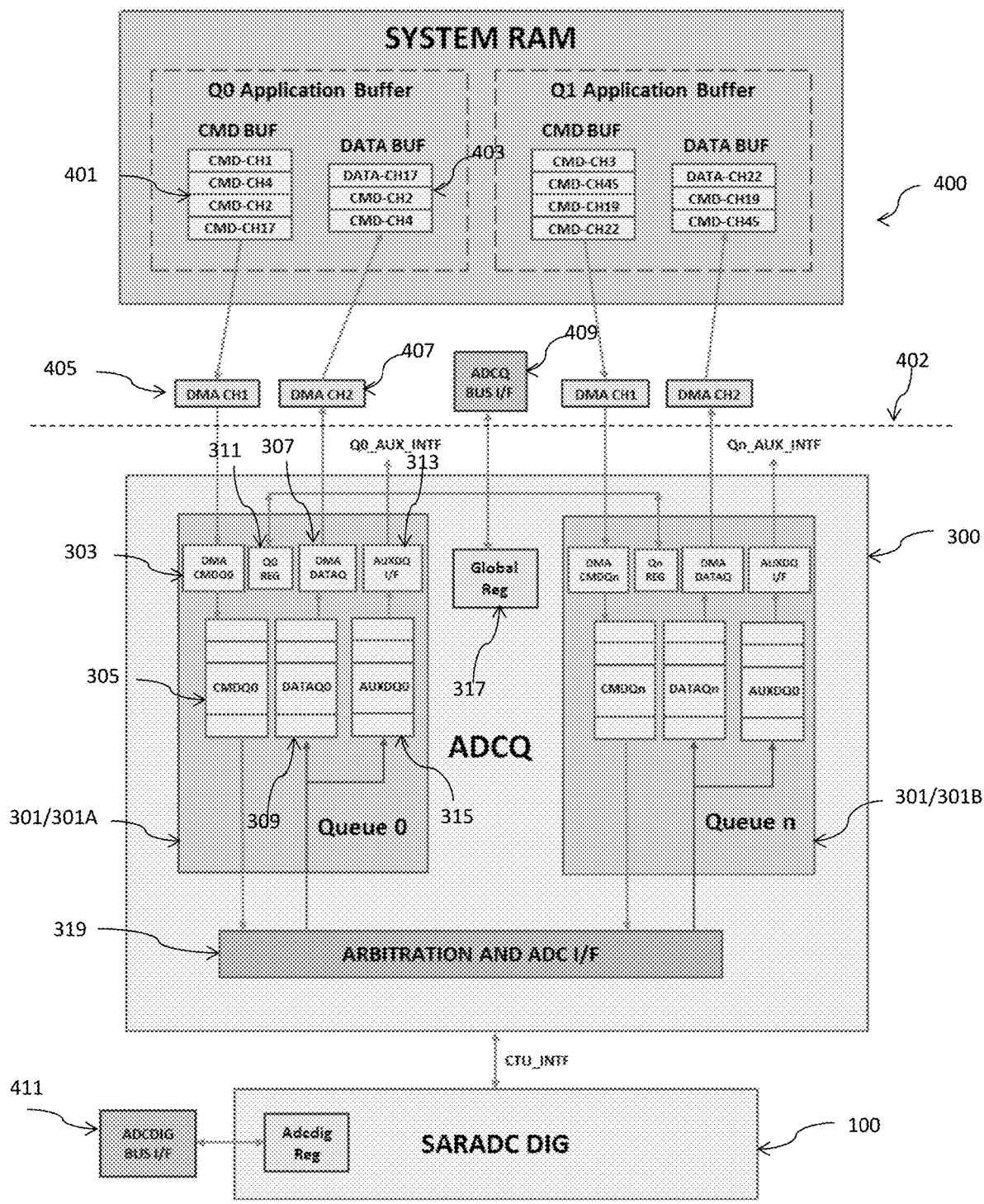
FIG. 3 illustrates a more detailed block diagram of the A/D conversion system of FIG. 1, in an embodiment.

FIG. 3 illustrates a block diagram with more details for the A/D conversion system 500 of FIG. 1, in an embodiment. Note that for clarity, not all components of the A/D conversion system 500 are illustrated in FIG. 3.

Referring to FIG. 3, some functional blocks of the controller 400 are illustrated above the dashed line 402. For example, FIG. 3 shows the System Random Access Memory (RAM) of the controller 400, which may be or comprise the code memory and/or the data memory in FIG. 2. In the example of FIG. 3, the System RAM has two applications running in parallel in two application buffers (e.g., Q0 Application Buffer and Q1 Application Buffer). The Q0 Application Buffer and the Q1 Application Buffer are similar to each other, since they are two instances of an application buffer. Each of the application buffers has a command buffer 401 and a data buffer 403, where the command buffer 401 stores the commands that are sent from the controller 400 to the digital interface block 300, and the data buffer 403 stores the digital data (converted by the ADC 100) that are sent from the digital interface block 300 to the controller 400. The command buffer 401 and the data buffer 403 may be, e.g., a First-In First-Out (FIFO) buffers.

In FIG. 3, the command buffer 401 is coupled to a DMA controller 405 of the controller 400, and the data buffer 403 is coupled to a DMA controller 407 of the controller 400. The DMA controllers 405 and 407 are used for transferring commands or data between the controller 400 and the digital interface block 300. FIG. 3 further illustrates an interface block 409 of the controller 400, which interface block 409 may be used by the controller 400 to set certain control registers of the digital interface block 300, such as the global register 317.

Still referring to FIG. 3, the digital interface block 300 includes one or more queue block 301 (e.g., 301A and 301B). The one or more queue blocks 301 are instances of the same hardware block (e.g., queue block), thus have the same or similar structure, in some embodiments. In the example of FIG. 3, two queue blocks 301A and 301B are illustrated, each coupled to a respective application buffers in the controller 400. The number of queue blocks in the digital interface block 300 shown in FIG. 3 is illustrative and non-limiting, any suitable number of queue blocks may be implemented in the digital interface block 300, as one skilled in the art readily appreciates. These and other variations are fully intended to be included within the scope of the present disclosure.

In FIG. 3, the queue block 301 (e.g., 301A or 301B) includes a command queue 305, a data queue 309, and an optional auxiliary data queue 315. The queue block 301 also have DMA command registers 303 coupled between the command queue 305 and the DMA controller 405, and have DMA data registers 307 coupled between the data queue 309 and the DMA controller 407. The DMA command registers 303 and the DMA data register 307 each includes a plurality of DMA registers to support DMA burst mode transfer. In an embodiment where the queue block 301 includes the auxiliary data queue 315, the queue block 301 further includes an auxiliary data queue interface 313 for interaction between the auxiliary data queue 315 and another functional block (not illustrated) that processes the digital samples from the ADC 100. The command queue 305, the data queue 309, and the auxiliary data queue 315 are implemented as FIFO buffers, in some embodiments.

The queue block 301 in FIG. 3 includes a queue register 311, which may be used to set properties specific to the queue block 301 and to control operation of the queue block 301. FIG. 3 further illustrates a global register 317, which may be used to set properties that are common to all the queues blocks 301 and to control operation of the digital interface block 300. In addition, the digital interface block 300 includes an arbitration and interface block 319, which arbitrates the access priority between the queues blocks 301, and functions as an interface between the ADC 100 and the digital interface block 300. FIG. 3 further illustrates an ADC digital bus interface 411, which may be part of the controller 400, and may be used by the controller 400 to set control registers of the ADC 100.

Figure 4:
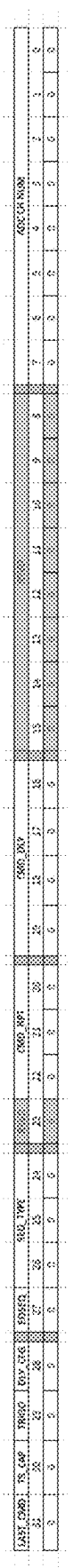
FIG. 4 illustrates the structure of a command frame, in an embodiment.

FIG. 4 illustrates the structure of a command frame, in an embodiment. The command frame shows the various bit fields of a command sent from the controller 400 to the digital interface block 300. In FIG. 4, the first row shows the name of the bit fields, the second row shows the bit locations within a command frame, and the third row shows the default value for the bits in the command frame.

In the example of FIG. 4, each command frame has 32 bits, and the 32 bits are divided into different bit fields with different definitions. For example, bits 0-7 of the command define ADC_CH_NUM [7:0], which indicates the number of the ADC channel controlled by the command (e.g., to be converted by the ADC 100). Up to 256 ADC channels may be supported by the command frame of FIG. 4. Bits 16-19 define CMD_DLY [3:0], and bit 28 defines DLY_CFG, where CMD_DLY [3:0] and DL_CFG determine the value of a programmable channel delay before conversion of the ADC channel indicated by ADC_CH_NUM [7:0]. Bits 20-22 define CMD_RPT [0:2], which indicates a channel oversampling factor (also referred to as a channel repeat factor). Bits 24-26 define SEQ_TYPE [2:0], which indicates the sequence type for the sequence of commands stored in the command queue 305. Bit 31 defines LAST_CMD, which indicates whether the current command is the last command in a sequence of commands. Some bits in the command are reserved bits (labeled as RSVD). Details of the various bit fields and their usage for controlling the operation of the ADC 100 are discussed hereinafter. One skilled in the art will readily appreciate that command frame structure illustrated in FIG. 4 is merely a non-limiting example, other command frame structures are possible and are fully intended to be included within the scope of the present disclosure.

Figure 5B:
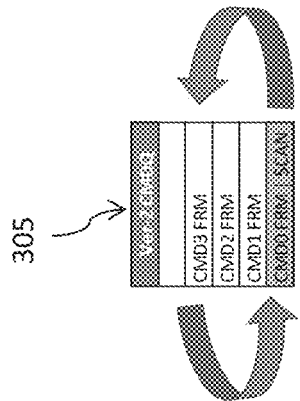
FIGS. 5A-5C illustrate different scan mode operations of the A/D conversion system of FIG. 1, in some embodiments.
Figure 5C:
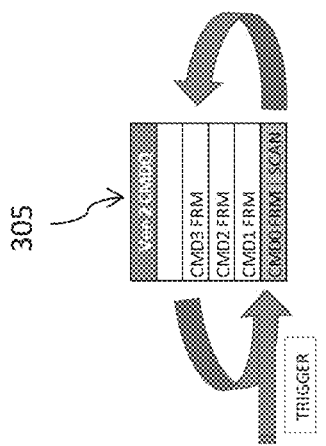
Figure 5A:
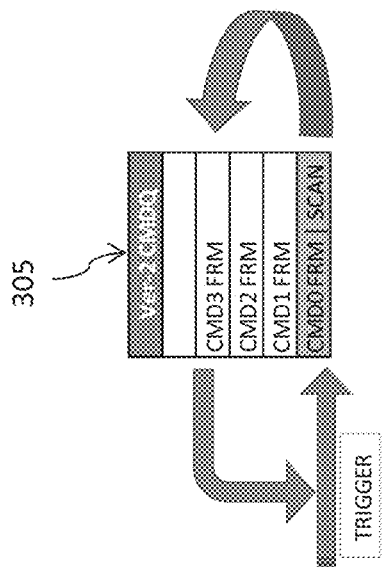

FIGS. 5A-5C illustrate different scan mode operations of the A/D conversion system 500 of FIG. 1, in some embodiments. In particular, FIGS. 5A, 5B, and 5C illustrate the Triggered Scan mode, the Triggered Once Scan mode, and the Non-Triggered Scan mode, respectively.

Referring to FIG. 5A, to operate the ADC 100 in the Triggered Scan mode, the controller 400 sends a sequence of measurement commands from the command buffer 401 (see FIG. 3) to the command queue 305 of a respective queue block 301. Transferring of the sequence of measurement commands from the controller 400 to the command queue 305 is done by the DMA controller 405, details of which are discussed below with reference to FIG. 9. In scan mode, the sequence of measurement commands may be executed multiple times, which is also referred to as executed in multiple scans.

In the example of FIG. 5A, the sequence of measurement commands includes four measurement commands, such as CMD0, CMD1, CMD2, and CMD3. Each of the measurement commands include a bit field ADC_CH_NUM [7:0] (see FIG. 4) indicating the ADC channel number for that measurement command. The channel number in each of the measurement commands define a channel sequence (also referred to as a channel list), which indicates the ADC channels to be converted into digital data and the order in which the ADC channels are converted. Note that the channel number in each measurement command can be any valid channel number, and the channel sequence can include channel numbers arranged in any order. For example, the channel numbers in the four commands CDM0, CMD1, CMD2, and CMD3 may be 1, 10, 3, and 2, respectively, which means that the analog signals at the ADC channels 1, 10, 3, and 2 are sequentially converted into digital data in that order during each scan of the scan mode.

In some embodiments, the bit field SEQ_TYPE [2:0] of the first measurement command CMD0 is checked by the digital interface block 300 (e.g., by the queue block 301) to determine the scan mode, and the bit fields SEQ_TYPE [2:0] in subsequent commands of the sequence of commands are ignored by the digital interface block 300. The three bits of SEQ_TYPE [2:0] could define up to eight different scan modes. In the illustrated embodiments, at least three scan modes, e.g., the Triggered Scan mode, the Triggered Once Scan mode, and the Non-Triggered Scan mode are defined by SEQ_TYPE [2:0]. In the example of FIG. 5A, the bit field SEQ_TYPE [2:0] of the first measurement command has a pre-determined value that corresponds to the Triggered Scan mode.

In the Triggered Scan mode, the digital interface block 300 (see FIG. 3) waits for a trigger signal before starting execution of the sequence of measurement commands stored in the command queue 305. The trigger signal is a hardware signal, e.g., a rising edge or a falling edge of a control signal, in an embodiment. In another embodiment, the trigger signal is a bit in a control register, and therefore, by setting a control bit in the control register to a pre-determined value (e.g., changing the bit value from zero to one), the controller 400 may trigger the queue block 301.

Once the digital interface block 300 detects the trigger signal, it sends the sequence of measurement commands sequentially to the ADC 100 through the custom interface 109 (see FIG. 1). Since the command queue 305 is a FIFO buffer, the sequence of measurement commands stored in the command queue 305 is sent to the ADC 100 in the order it was received. In embodiments where the measurement command indicates that channel delay or channel oversampling is needed, the queue block 301 may modify the measurement commands before sending them to the ADC 100, details of which are discussed hereinafter with reference to FIGS. 6A-6B, 7A-7B, and 8A-8B. For simplicity, the examples illustrated in FIGS. 5A, 5B, and 5C assume that no channel delay and no channel oversampling is indicated by the measurement commands.

In Triggered Scan mode, after the sequence of measurement commands has been executed once, the digital interface block 300 waits for the next trigger signal, and the sequence of measurement commands is still stored in the queue block 301. When the next trigger signal arrives, the digital interface block 300 executes the sequence of measurement commands again by sending the measurement commands to the ADC 100 through the custom interface 109. The Triggered Scan mode ends when a STOP Scan command is sent from the controller 400 to the digital interface block 300, e.g., by setting a control bit of a control register (e.g., 311 in FIG. 3) of the digital interface block 300. Once the STOP Scan command is received, execution of the current sequence of measurement commands continues until the last command (e.g., indicated by the bit field LAST_CMD) is sent to the ADC 100, then the command queue 305 is reset, and the scan mode is reset.

In some embodiments, when the custom interface 109 receives a measurement command, the custom interface 109 decodes (e.g., interprets) the various control bits in the measurement command, and generates corresponding control signals to control operation of the analog block 101 of the ADC 100 and to control operation of the multiplexer 200, such that the analog signal at the input channel of the multiplexer 200 indicated by the channel number ADC_CH_NUM [7:0] is converted by the ADC 100 into a digital value. The converted digital value is then sent back to the data queue 309 (see FIG. 3) of the queue block 301 through the custom interface 109. The custom interface 109 is a private interface between the ADC 100 and the digital interface block 300, which private interface ensures low latency data transmission between the ADC 100 and the digital interface block 300, and ensures that transmission of the measurement commands is not affected by other bus transfers. In some embodiments, when the controller 400 controls the operation of the ADC 100 through the digital interface block 300, the digital interface 300 decodes the measurement commands from the controller 400, modifies the measurement commands and sends the modified measurement comments to the control logic 105 via the custom interface 109. The control logic 105 generates the control signals in accordance with the modified measurement commands to control the operation of the analog block 101 and operation of the multiplexer 200.

FIG. 5B illustrates the Triggered Once Scan mode operations of the A/D conversion system 500 of FIG. 1, in an embodiment. In the example of FIG. 5B, the SEQ_TYPE [2:0] of the first measurement command in the sequence of measurement commands has a value that corresponds to the Trigger Once Scan mode. The Triggered Once Scan mode is similar to the Trigger Scan mode of FIG. 5A, but after the first trigger signal is received by the digital interface block 300, the sequence of measurement commands is executed, and without checking for additional trigger signal, the sequence of measurement commands is executed again and again, until the STOP SCAN command is received by the digital interface block 300. The response of the digital interface block 300 to the STOP SCAN command is the same to those discussed above for FIG. 5A, thus details are not repeated.

FIG. 5C illustrates the Non-Triggered Scan mode operations of the A/D conversion system 500 of FIG. 1, in an embodiment. In the example of FIG. 5C, the SEQ_TYPE [2:0] of the first measurement command in the sequence of measurement commands has a value that corresponds to the Non-Trigger Scan mode. In the Non-Triggered Scan mode, the digital interface block 300 does not need a trigger to execute the sequence of measurement commands. Instead, execution of the sequence of measurement commands starts as soon as the first measurement commands is loaded (e.g., written) into the command queue 305. The sequence of measurement commands is executed again and again, until the STOP SCAN command is received by the digital interface block 300. The response of the digital interface block 300 to the STOP SCAN command is the same to those discussed above for FIG. 5A, thus details are not repeated.

Advantage of the above described scan mode operations includes flexible channel list for channel scan, which allows any number of ADC channels to be converted by the ADC 100 in any order. This flexibility may not be available without the digital interface block 300. In addition, since the sequence of measurement commands remain in the command queue 305 after each scan, the controller 400 only needs to send the sequence of measurement commands once to the command queue 305, and the sequence of measurement commands stored in the command queue 305 may be used multiple times in the scan mode operation. This may be achieved by implementing the command queue 305 as a FIFO buffer, and reading command out of the FIFO buffer may be implemented by changing the address of a data pointer of the FIFO buffer without changing (e.g., loosing) the contents stored in the FIFO buffer. Compared with a reference method where the controller 400 needs to send the sequence of measurement commands to the ADC 100 for each scan, the presently disclosed A/D conversion system 500 saves significant amount of resource for the controller 400 and significantly reduces data traffic over the buses of the A/D conversion system 500. For example, the DMA controller 405 (see FIG. 3) only transfers the sequence of command once from the command buffer 401 of the controller to the command queue 305, and the DMA controller 405 is stopped after the last command in the sequence of commands is stored into the command queue 305.

Figures 6A, 6B:
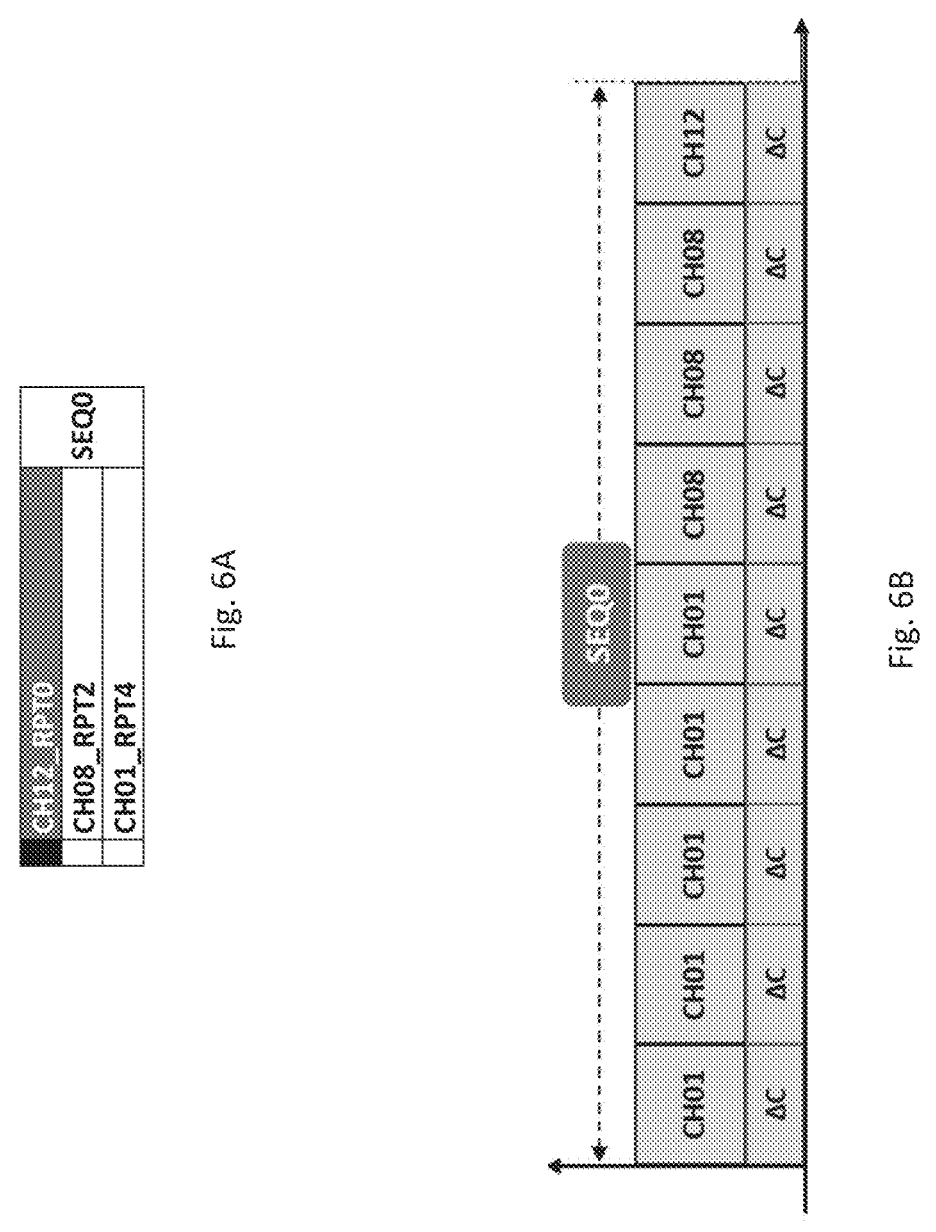

FIGS. 6A and 6B illustrate the channel oversampling operation of the A/D conversion system of FIG. 1, in an embodiment. In some applications, it may be advantageous to sample (e.g., convert) an ADC channel multiple times during each scan of the scan mode operation. For example, an ADC channel may be sampled multiple times to obtain multiple ADC samples (e.g., multiple digital data) in each scan, and the multiple ADC samples may be averaged to obtain an ADC sample with less noise, thereby improving the quality of the ADC output.

FIG. 6A illustrates a sequence of measurement commands that includes three commands. The first command has a channel number of 1 and a channel oversampling factor of 4, the second command has a channel number of 8 and a channel oversampling factor of 2, and the third command has a channel number of 2 and a channel oversampling factor of 0. The channel oversampling factor is defined by the bit field CMD_RPT [2:0] of each command (see FIG. 4), which defines a value from zero to seven. In some embodiments, the queue block 301 repeats each command CMD_RPT times, and therefore, sends each command a total of (CMD_RPT+1) times to the custom interface 109 of the ADC 100, where CMD_RPT is the value of the bit field CMD_RPT [2:0]. The repeated commands may be referred to as a modified command of the original command, and the above operation may be described as the queue block 301 modifying the original command (e.g., by repeating) to generate a modified command and sending the modified command to the custom interface 109 of the ADC 100.

Referring now to FIG. 6B, which shows the sequence of modified commands sent from the queue block 301 to the custom interface 109 of the ADC 100. For the example of FIG. 6A, the first command is sent (4+1=5) times to the ADC 100, the second command is sent (2+1=3) times to the ADC 100, and the third command is sent (0+1=1) time to the ADC 100, which causes the ADC channel 1 to be sampled 5 times in each scan, the ADC channel 8 to be sampled 3 times in each can, and the ADC channel 12 to be sampled 1 time in each scan. As an example, consider an A/D conversion system 500 with a sampling frequency of 1 MHz for the ADC 100. For the command sequence illustrated in FIG. 6A, during each scan, the ADC 100 may produce five consecutive digital samples for ADC channel 1 with, e.g., a 12-bit resolution, and the five digital samples may be spaced from each other by 1 µs. In addition, the ADC 100 may produce, e.g., three 12-bit digital samples for ADC channel 8 that are spaced from each other by 1 µs during each scan. Furthermore, the ADC 100 may produce, e.g., a 12-bit digital sample for ADC channel 12 during each scan. Therefore, in this example, the sequence of measurement command in FIG. 6A is executed in 9 µs and produces nine digital samples. Assuming that a Triggered Scan mode with a trigger frequency of 1 KHz is selected, then another nine digital samples is produced about 1 ms after the first nine digital samples are produced. The sampling process repeats until a STOP SCAN command is received.

Figures 7A, 7B:
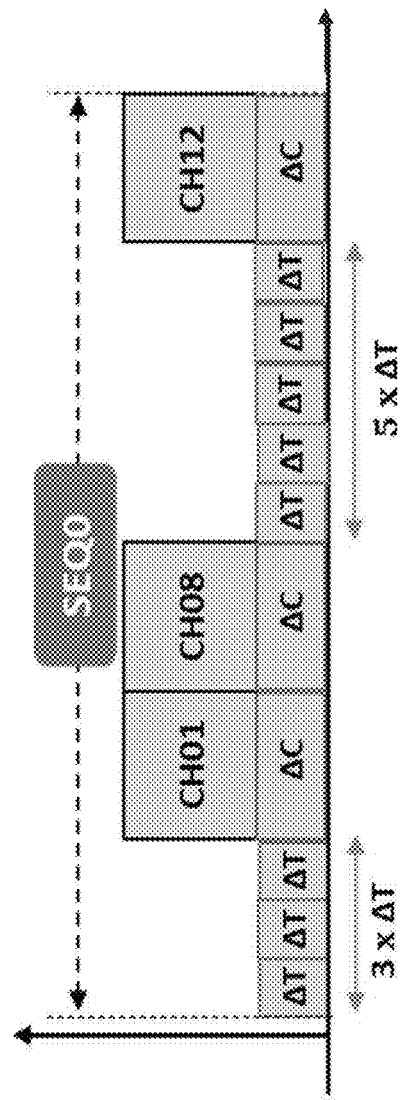
FIGS. 7A and 7B illustrate the programmable delay operation of the A/D conversion system of FIG. 1, in an embodiment.

FIGS. 7A and 7B illustrate the programmable delay operation of the A/D conversion system 500 of FIG. 1, in an embodiment. In some applications, it may be advantageous to add some spacing (e.g., time delay) between two adjacent ADC channels in a channel sequence. The spacing may need to be programmable for different applications. Such a requirement is difficult to accommodate for A/D conversion systems without the present disclosure. A non-ideal solution without the present disclosure may need to send dummy commands (e.g., command that takes time to execute but does not do anything) between measurement commands. However, such a non-ideal solution increases the memory foot print in both the command buffer 401 (see FIG. 3) and the command queue 305, and requires more DMA requests and more bus cycles for transferring the dummy commands. The programmable delay operation described herein accommodates the above requirement with significantly reduced memory usage, fewer DMA requests, and fewer bus cycles.

FIG. 7A shows an example sequence of measurement commands having three commands. The first measurement commands has a channel number of 1 and a channel delay value of 3 (defined by bit field CMD_DLY [3:0]), the second measurement commands has a channel number of 8 and a channel delay value of 0, and the third measurement commands has a channel number of 12 and a channel delay value of 5. In the example of FIGS. 7A and 7B, the DLY_CFG bit in the command is set to a value (e.g., "1") that indicates a linear delay, which means that the amount of delay added is CMD_DLY×ΔT, where CMD_DLY is the value represented by the bit field CMD_DLY [3:0], and ΔT is pre-determined period of time.

FIG. 7B shows the modified commands sent from the queue block 301 to the custom interface 109 of the ADC 100. As illustrated in FIG. 7B, the queue block 301 modifies each command by adding a variable delay specified by the channel delay value in front of each command. This may be achieved by using a hardware delay block (not individually illustrated) within the digital interface block 300 to delay each command by the specified channel delay (e.g., CMD_DLY×ΔT), then sending the delayed command to the custom interface 109 of the ADC 100. In other words, the digital interface block 300 modifies the sequence of commands by changing the spacing (e.g., by adding different time delays) between commands, or by adding a variable time delay before each of the commands, and the modified sequence of commands is then sent to the custom interface 109 of the ADC 100.

FIGS. 8A and 8B illustrate the programmable delay operation of the A/D conversion system of FIG. 1, in another embodiment. The example in FIGS. 8A and 8B is similar to that of FIGS. 7A and 7B, but the DLY_CFG bit in the command is set to a value (e.g., "0") that indicates an exponential delay, which means that the amount of delay added is $2^{CMD\_DLY} \times \Delta T$, where CMD_DLY is the value represented by the bit field CMD_DLY [3:0], and $\Delta T$ is pre-determined period of time.

FIG. 8A shows the sequence of measurement commands, and FIG. 8B shows the modified sequence of commands send to the custom interface 109 of the ADC 100, where the modified sequence of command has variable delays added in front of each measurement command. Note that channel oversampling operation and the channel delay operation illustrated in FIGS. 6A-6B, 7A-7B, and 8A-8B can be combined with the scan operation illustrated in FIGS. 5A-5C, as skilled artisan readily appreciate.

Figure 9:
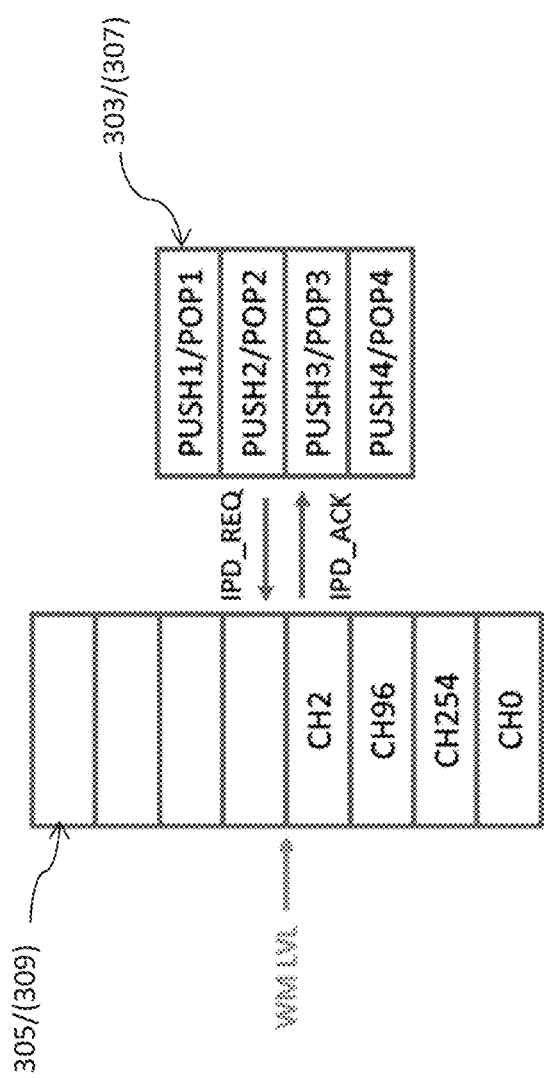
FIG. 9 illustrates the direct memory access (DMA) operation of the A/D conversion system of FIG. 1, in an embodiment.

FIG. 9 illustrates the Direct Memory Access (DMA) operation of the A/D conversion system of FIG. 1, in an embodiment. In particular, FIG. 9 illustrates the FIFO buffer and the DMA registers of the queue block 301 that are used for DMA transfer between the controller 400 and the queue block 301. Note that DMA transfer may be used to transfer commands from the controller 400 to the command queue 305 (see FIG. 3), or may be used to transfer ADC digital samples from the data queue 309 to the controller 400. FIG. 9 is used to illustrate both types of DMA transfers, as discussed hereinafter.

For example, for DMA transfer from the controller 400 to the command queue 305, the FIFO buffer shown on the left side of FIG. 9 is the command queue 305, and the registers shown on the right side of FIG. 9 are the DMA command registers 303. Four DMA command registers are illustrated in FIG. 9 as a non-limiting example, and any suitable number of DMA registers may be used. To transfer commands from the controller 400 to the command queue 305, the digital interface block 300 checks the number of free entries (e.g., un-occupied entries) in the command queue 305. As an example, an entry in the command queue 305 may be a 32-bit or 64-bit memory unit. The number of free entries in the command queue 305 may be tracked by an indicator called water mark level. When the number of free entries in the command queue 305 is equal to or larger than the number of DMA command registers (e.g., four), the queue block 301 sends a DMA request to the DMA controller 405. In response, the DMA controller 405 starts a burst mode DMA transfer to transfer, e.g., four commands into the DMA command registers 303, which is then stored in the command queue 305. Note that the more than one DMA command registers 303 allow for the burst mode DMA transfer, which not only improves the efficiency of DMA transfers (e.g., less DMA requests, less bus cycles), but also allows a plurality of measurement commands (e.g., four) to be transferred without being interrupted by another DMA transfer with a higher priority.

For DMA transfer from the data queue 309 to the controller 400, the FIFO buffer shown on the left side of FIG. 9 is the data queue 309, and the registers shown on the right side of FIG. 9 are the DMA data registers 307. Similar to the discussion above, since more than one DMA data registers 307 are available, burst mode DMA transfer is supported, which allows a plurality of ADC samples (e.g., four) to be transferred from the data queue 309 to the controller 400 without being interrupted by another DMA transfer with higher priority. In some embodiments, to transfer the ADC samples from the data queue 309 to the controller 400, the digital interface block 300 checks the number of new entries (e.g., new or un-sent ADC samples that needs to be sent to the controller 400) in the data queue 309. When the number of new entries is equal to or larger than the number of DMA data registers (e.g., four), the queue block 301 loads, e.g., four ADC samples into the DMA data registers 307 and sends a DMA request to the DMA controller 407. In response, the DMA controller 407 starts a burst mode DMA transfer to transfer, e.g., four ADC samples to the controller 400.

Figure 10:
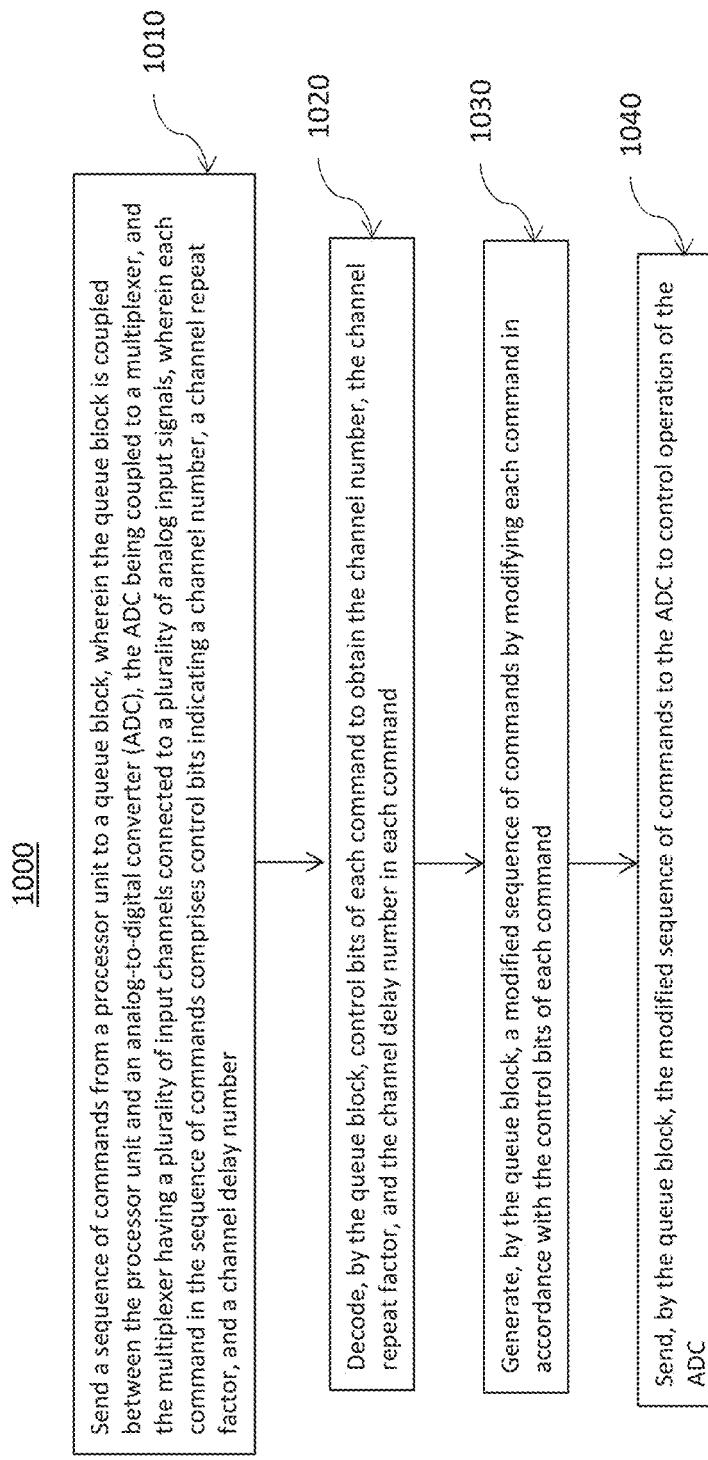
FIG. 10 illustrates a flow chart of a method of operating an A/D conversion system, in some embodiments.

FIG. 10 illustrates a flow chart of a method of operating an A/D conversion system, in some embodiments. It should be understood that the embodiment method shown in FIG. 10 is merely an example of many possible embodiment methods. One of ordinary skill in the art would recognize many variations, alternatives, and modifications. For example, various steps as illustrated in FIG. 10 may be added, removed, replaced, rearranged and repeated.

Referring to FIG. 10, at step 1010, a sequence of commands is sent from a processor to a queue block, wherein the queue block is coupled between the processor and an analog-to-digital converter (ADC), the ADC being coupled to a multiplexer, and the multiplexer having a plurality of input channels connected to a plurality of analog input signals, wherein each command in the sequence of commands comprises control bits indicating a channel number, a channel repeat factor, and a channel delay number. At step 1020, the queue block decodes control bits of each command to obtain the channel number, the channel repeat factor, and the channel delay number in each command. At step 103o, the queue block generates a modified sequence of commands by modifying each command in accordance with the control bits of each command. At step 1040, the queue block sends the modified sequence of commands to the ADC to control operation of the ADC.

Embodiments may achieve advantages. For example, the various scan modes allow any numbers of ADC channels to be converted into digital data in any order. Each ADC channel may be sampled multiple times during each scan, and a programmable delay may be inserted before conversion of each ADC channel. These enhanced functions, which may not be available before, are achieved without increasing memory foot print or increasing bus cycles. For example, the queue block in the digital interface block decodes the control bits of the measurement commands, and modifies each measurement command in accordance with the channel delay value and the channel oversampling factor indicated by the control bits. The modified commands are then sent to the ADC to control operation of the ADC. Due to the structure of the disclosed A/D conversion system, the sequence of commands only needs to be transferred once from the controller to the queue block, which reduces the number of DMA request and bus cycles for the DMA transfer. As another example, the queue block of the digital interface block has more than one DMA registers (e.g., DMA command registers, or DMA data registers) to support burst mode DMA transfer, which improves the efficiency of DMA transfer and ensures that the measurement commands (or ADC data) in each burst mode transfer are transferred without interruption from another higher priority DMA transfer.

Example embodiments of the present invention are summarized here. Other embodiments can also be understood from the entirety of the specification and the claims filed herein.

Example 1. In an embodiment, an analog-to-digital conversion system includes an analog-to-digital converter (ADC); a multiplexer, wherein the multiplexer has a plurality of input channels that are configured to be coupled to a plurality of analog input signals, wherein an output terminal of the multiplexer is coupled to an input terminal of the ADC; and a digital interface circuit configured to be coupled between the ADC and a processor, wherein the digital interface circuit is configured to: receive a sequence of commands from the processor, wherein each command of the sequence of commands comprises a channel number that indicates an input channel of the multiplexer, wherein channel numbers contained in the sequence of commands define a channel sequence; store the sequence of commands in a command First-In First-Out (FIFO) buffer of the digital interface circuit; send the sequence of commands stored in the command FIFO buffer to the ADC for a first time to control operation of the ADC, wherein analog input signals at input channels of the multiplexer specified by the channel sequence are converted into digital data sequentially for the first time; and send the sequence of commands stored in the command FIFO buffer to the ADC for a second time, wherein the analog input signals at the input channels of the multiplexer specified by the channel sequence are converted into digital data sequentially for the second time.

Example 2. The analog-to-digital conversion system of example 1, wherein sending the sequence of commands stored in the command FIFO buffer to the ADC for the first time comprises: receiving, by the digital interface circuit, a first trigger signal; and in response to receiving the first trigger signal, sending, by the digital interface circuit, the sequence of commands stored in the command FIFO buffer to the ADC for the first time.

Example 3. The analog-to-digital conversion system of example 2, wherein sending the sequence of commands stored in the command FIFO buffer to the ADC for the second time comprises: receiving, by the digital interface circuit, a second trigger signal; and in response to receiving the second trigger signal, sending, by the digital interface circuit, the sequence of commands stored in the command FIFO buffer to the ADC for the second time.

Example 4. The analog-to-digital conversion system of example 2, wherein sending the sequence of commands stored in the command FIFO buffer to the ADC for the second time comprises: after sending the sequence of commands stored in the command FIFO buffer to the ADC for the first time, sending, by the digital interface circuit, the sequence of commands stored in the command FIFO buffer to the ADC for the second time without waiting for another trigger signal.

Example 5. The analog-to-digital conversion system of example 4, wherein the digital interface circuit is further configured to: check a status bit of a control register of the digital interface circuit; and in response to detecting that the status bit of the control register is set to a pre-determined value, stop sending the sequence of commands stored in the command FIFO buffer to the ADC.

Example 6. The analog-to-digital conversion system of example 1, wherein the digital interface circuit is configured to start sending commands stored in the command FIFO buffer to the ADC immediately after a first command of the sequence of commands is stored in the command FIFO buffer without checking for a trigger signal.

Example 7. The analog-to-digital conversion system of example 1, wherein each command of the sequence of commands further comprises control bits indicating a channel oversampling factor N, wherein the digital interface circuit is configured to send each command N+1 times to the ADC such that the analog input signal at the input channel indicated by the channel number of each command is converted into digital data N+1 times for each sequence of commands.

Example 8. The analog-to-digital conversion system of example 1, wherein each command of the sequence of commands further comprises control bits indicating a pre-determined period of delay, wherein the digital interface circuit is configured to: modify the sequence of commands by inserting the pre-determined period of delay before each command; and sending the modified sequence of commands to the ADC such that conversion of the analog input signal at the input channel indicated by the channel number of each command is delayed by the pre-determined period of delay.

Example 9. The analog-to-digital conversion system of example 1, wherein the digital interface circuit is configured to be coupled between the ADC and a first direct memory access (DMA) controller of the processor.

Example 10. The analog-to-digital conversion system of example 9, wherein the digital interface circuit further comprises a first number of DMA command registers coupled between the first DMA controller and the command FIFO buffer, wherein the digital interface circuit is configured to: determine if a number of free entries in the command FIFO buffer is equal to or larger than the first number of DMA command registers; and in response to determining that the number of free entries in the command FIFO buffer is equal to or larger than the first number of DMA command registers, send a DMA request to the first DMA controller for transferring the first number of commands to the DMA command registers in a burst mode operation.

Example 11. The analog-to-digital conversion system of example 10, wherein the digital interface circuit further comprises: a data FIFO buffer for storing converted digital data from the ADC; and a second number of DMA data registers configured to be coupled between the data FIFO buffer and a second DMA controller of the processor.

Example 12. The analog-to-digital conversion system of example 11, wherein the digital interface circuit is configured to: determine if a number of new data entries in the data FIFO buffer is equal to or larger than the second number of DMA data registers; and in response to determining that the number of new data entries in the data FIFO buffer is equal to or larger than the second number of DMA data registers, send a DMA request to the second DMA controller for transferring the second number of new data entries to the processor in a burst mode operation.

Example 13. A digital interface circuit includes a queue block configured to be coupled between an analog-to-digital converter (ADC) and a Direct Memory Access (DMA) controller of a processor, wherein the queue block comprises a command buffer and is configured to: receive a first command from the DMA controller; store the first command in the command buffer; modify the first command in accordance with first control bits of the first command to generate a modified first command; and send the modified first command to the ADC.

Example 14. The digital interface circuit of example 13, wherein the first control bits of the first command comprises an oversampling factor N, wherein modifying the first command comprises repeating the first command N times.

Example 15. The digital interface circuit of example 13, wherein the first control bits of the first command comprises a delay T, wherein modifying the first command comprises adding the delay T before the first command.

Example 16. The digital interface circuit of example 13, wherein the queue block further comprises a first number of DMA command registers configured to be coupled between the DMA controller and the queue block, wherein the queue block is configured to: determine a number of free entries in the command buffer; and in response to determining that the number of free entries in the command buffer is equal to or larger than the first number of DMA command registers, request a DMA transfer from the DMA controller for transferring the first number of commands in a burst mode operation.

Example 17. The digital interface circuit of example 13, wherein the queue block further comprises a data buffer, wherein the queue block is further configured to: receive one or more digital samples from the ADC; store the one or more digital samples in the data buffer; and send the one or more digital samples to the processor through another DMA controller of the processor.

Example 18. A method of operating an analog-to-digital conversion system includes sending a sequence of commands from a processor to a queue block, wherein the queue block is coupled between the processor and an analog-to-digital converter (ADC), the ADC being coupled to a multiplexer, and the multiplexer having a plurality of input channels connected to a plurality of analog input signals, wherein each command in the sequence of commands comprises control bits indicating a channel number, a channel repeat factor, and a channel delay number; decoding, by the queue block, control bits of each command to obtain the channel number, the channel repeat factor, and the channel delay number in each command; generating, by the queue block, a modified sequence of commands by modifying each command in accordance with the control bits of each command; and sending, by the queue block, the modified sequence of commands to the ADC to control operation of the ADC.

Example 19. The method of example 18, wherein generating, by the queue block, the modified sequence of commands comprises adding a pre-determined period of delay to each command in accordance with the channel delay number or repeating each command a plurality of times in accordance with the channel repeat factor.

Example 20. The method of example 18, further comprising: converting, by the ADC, an analog signal at an input channel of the multiplexer indicated by the channel number into a digital value a first number of times, wherein the first number of times is indicated by the channel repeat factor, wherein a delay is inserted before conversion of the analog signal, the delay being indicated by the channel delay number.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An analog-to-digital conversion system comprising:
an analog-to-digital converter (ADC);
a multiplexer, wherein the multiplexer has a plurality of input channels that are configured to be coupled to a plurality of analog input signals, wherein an output terminal of the multiplexer is coupled to an input terminal of the ADC; and
a digital interface circuit configured to be coupled between the ADC and a processor, wherein the digital interface circuit is configured to:
receive a sequence of commands from the processor, wherein each command of the sequence of commands comprises a channel number that indicates an input channel of the multiplexer, and comprises control bits for the input channel indicated by the channel number;
store the sequence of commands in a command buffer of the digital interface circuit; and
modify each command of the sequence of commands in accordance with the control bits.

2. The analog-to-digital conversion system of claim 1, wherein the digital interface circuit is further configured to send a modified sequence of commands to the ADC for a first time, wherein the ADC converts the analogy input signals at input channels indicated by the channel numbers contained in the modified sequence of commands into digital values.

3. The analog-to-digital conversion system of claim 2, wherein the digital interface circuit is further configured to, after sending the modified sequence of commands to the ADC for a first time, send the modified sequence of commands to the ADC for a second time.

4. The analog-to-digital conversion system of claim 3, wherein the digital interface circuit is configured to:
detect a first trigger signal before sending the modified sequence of commands to the ADC for the first time; and
in response to detecting the first trigger signal, sending the modified sequence of commands to the ADC for the first time.

5. The analog-to-digital conversion system of claim 4, wherein the digital interface circuit is further configured to:
after sending the modified sequence of commands to the ADC for the first time, detect a second trigger signal; and
in response to detecting the second trigger signal, sending the modified sequence of commands to the ADC for the second time.

6. The analog-to-digital conversion system of claim 4, wherein the digital interface circuit is further configured to:
after sending the modified sequence of commands to the ADC for the first time, send the modified sequence of commands to the ADC for the second time without detecting another trigger signal.

7. The analog-to-digital conversion system of claim 6, wherein the digital interface circuit is further configured to:
check a status bit of a control register of the digital interface circuit; and
stop sending the modified sequence of commands to the ADC when the status bit is set to a pre-determined value.

8. The analog-to-digital conversion system of claim 2, wherein the digital interface circuit is configured to start sending the modified sequence of commands to the ADC without checking for a trigger signal.

9. The analog-to-digital conversion system of claim 1, wherein the control bits of each command comprise an oversampling factor N, wherein modifying each command comprises repeating each command a number of times in accordance with N.

10. The analog-to-digital conversion system of claim 1, wherein the control bits of each command comprise a delay T, wherein modifying each command comprises adding a delay before each command in accordance with T.

11. The analog-to-digital conversion system of claim 1, wherein the command buffer is a First-In First-Out (FIFO) buffer.

12. A digital interface circuit comprising:
a queue block configured to be coupled between an analog-to-digital converter (ADC) and a first Direct Memory Access (DMA) controller of a processor, wherein the queue block comprises a command buffer and is configured to:

receive a first command from the first DMA controller, the first command comprising first control bits, the first control bits comprising information indicating a first input channel of the ADC and a first channel oversampling factor for the first input channel;

store the first command in the command buffer; and instruct the ADC to sample the first input channel a first number of times by sending the first command to the ADC the first number of times, wherein the first number of times is determined by the first channel oversampling factor.

13. The digital interface circuit of claim 12, wherein the first control bits further comprises information indicating a first channel delay for the first input channel, wherein the queue block is further configured to wait for a period of time indicated by the first channel delay before sending the first command to the ADC each time.

14. The digital interface circuit of claim 12, wherein the queue block further comprises a second number of DMA command registers configured to be coupled between the first DMA controller and the command buffer, wherein the queue block is configured to:

determine a number of free entries in the command buffer; and in response to determining that the number of free entries in the command buffer is equal to or larger than the second number of DMA command registers, request a DMA transfer from the first DMA controller for transferring the second number of commands in a burst mode operation.

15. The digital interface circuit of claim 12, wherein the queue block further comprises a data buffer for storing digital samples from the ADC, and comprises a second number of DMA data registers configured to be coupled between the data buffer and a second DMA controller of the processor, wherein the queue block is further configured to:

determine a number of new data entries in the data buffer; and in response to determining that the number of new data entries in the data buffer is equal to or larger than the second number of DMA data registers, send a DMA request to the second DMA controller for transferring the number of new data entries to the processor in a burst mode operation.

16. The digital interface circuit of claim 12, wherein the queue block is further configured to:

receive a second command from the DMA controller, the second command comprising second control bits, the second control bits comprising information indicating a second input channel of the ADC and a second channel oversampling factor for the second input channel;

store the second command in the command buffer; and instruct the ADC to sample the second input channel a second number of times by sending the second command to the ADC the second number of times, wherein the second number of times is determined by the second channel oversampling factor.

17. The digital interface circuit of claim 16, wherein the queue block is further configured to, after sending the first command the second command to the ADC:

instruct the ADC to sample the first input channel the first number of times again by sending the first command to the ADC the first number of times again; and instruct the ADC to sample the second input channel the second number of times again by sending the second command to the ADC the second number of times again.

18. A method of operating an analog-to-digital conversion system, the method comprising:

receiving, by a queue block of the analog-to-digital conversion system, a sequence of commands from a processor, wherein the queue block is coupled between the processor and an analog-to-digital converter (ADC), the ADC being coupled to a multiplexer, and the multiplexer having a plurality of input channels connected to a plurality of analog input signals, wherein each command in the sequence of commands comprises control bits for controlling sampling of a respective input channel by the ADC;

decoding, by the queue block, control bits of each command;

generating, by the queue block, a modified sequence of commands by modifying each command in accordance with the control bits of each command; and sending, by the queue block, the modified sequence of commands to the ADC to control operation of the ADC.

19. The method of claim 18, wherein the control bits of each command include a channel number, a channel repeat factor, and a channel delay number, wherein generating the modified sequence of commands comprises:

adding a period of delay before each command in accordance with the channel delay number or repeating each command a plurality of times in accordance with the channel repeat factor.

20. The method of claim 18, further comprising, for each command of the modified sequence of commands received at the ADC:

converting, by the ADC, an analog signal at an input channel of the multiplexer indicated by the channel number into a digital value a first number of times.

* * * * *